(12) United States Patent
Chen

(10) Patent No.: US 11,515,879 B2
(45) Date of Patent: Nov. 29, 2022

(54) COUNTER

(71) Applicant: ANPEC ELECTRONICS CORPORATION, Hsinchu (TW)

(72) Inventor: Chih-Yuan Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 43 days.

(21) Appl. No.: 17/349,892

(22) Filed: Jun. 16, 2021

(65) Prior Publication Data

US 2022/0271757 A1   Aug. 25, 2022

(30) Foreign Application Priority Data

Feb. 25, 2021   (TW) .................................. 110106789

(51) Int. Cl.
| | |
|---|---|
| *H03K 21/00* | (2006.01) |
| *H03K 21/08* | (2006.01) |
| *G01J 1/46* | (2006.01) |
| *G01J 1/44* | (2006.01) |

(52) U.S. Cl.
CPC ................ *H03K 21/08* (2013.01); *G01J 1/46* (2013.01); *G01J 2001/4413* (2013.01)

(58) Field of Classification Search
CPC ...... H03K 21/00; H03K 21/02; H03K 21/023; H03K 21/08; H03K 21/10; H03K 23/00; H03K 21/002; G06G 7/18; G06G 7/1806; G06G 7/184; G06G 7/186; G01J 1/46; G01J 2001/4413
See application file for complete search history.

(56) References Cited

U.S. PATENT DOCUMENTS

| | | | |
|---|---|---|---|
| 11,067,440 B2 * | 7/2021 | Viswanath | ................ G01J 1/44 |
| 2017/0160129 A1 * | 6/2017 | Viswanath | ................ G01J 1/46 |

* cited by examiner

*Primary Examiner* — Long Nguyen
(74) *Attorney, Agent, or Firm* — Li & Cai Intellectual Property Office

(57) ABSTRACT

A counter is provided. A charge distributing circuit includes a first switch, a second switch, a third switch, a fourth switch, a third capacitor and a fourth capacitor. A first terminal of the first switch and a first terminal of the third switch are connected to a first input terminal of an operational amplifier. A second terminal of the first switch is connected to a first terminal of the third capacitor and a first terminal of the fourth switch. A second terminal of the third switch is connected to a first terminal of the fourth capacitor and a first terminal of the second switch. A second terminal of the third capacitor and a second terminal of the fourth capacitor are grounded. A second terminal of the second switch and a second terminal of the fourth switch are coupled to a reference voltage.

6 Claims, 3 Drawing Sheets

COUNTER

CROSS-REFERENCE TO RELATED PATENT APPLICATION

This application claims the benefit of priority to Taiwan Patent Application No. 110106789, filed on Feb. 25, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a counter, and more particularly to a counter that includes a charge distributing circuit and is applicable to an optical sensor.

BACKGROUND OF THE DISCLOSURE

A brightness of a screen requires adjustments under different environments so as to accommodate the vision of the human eye. Therefore, conventional ambient light sensors are widely applied to various electronic products such as mobile phones. The conventional ambient light sensor is used to sense an ambient light intensity in the environment where the electronic product is located. The brightness of the screen of the electronic product needs to be automatically adjusted according to the sensed ambient light intensity, such that the eyes of the user can feel comfortable anywhere during use of the electronic product. For example, when the ambient light intensity is too high in the environment where the user is located, the brightness of the screen needs to be reduced, so as not to be too harsh on the eyes of the user. However, the conventional ambient light sensors have poor accuracy in sensing the ambient light intensity.

SUMMARY OF THE DISCLOSURE

In response to the above-referenced technical inadequacies, the present disclosure provides a counter. The counter includes a first capacitor, a current supplying component, an operational amplifier, and a charge distributing circuit. The current supplying component is connected to the first capacitor and configured to supply a current to the first capacitor. A first input terminal of the operational amplifier is connected to the first capacitor, and is connected to an output terminal of the operational amplifier through a second capacitor. A second input terminal of the operational amplifier is coupled to an input voltage. The operational amplifier is configured to multiply a difference between a voltage of the first input terminal of the operational amplifier and the input voltage by a gain to output an operation amplified signal. The charge distributing circuit includes a first phase switch circuit, a second phase switch circuit, a third capacitor and a fourth capacitor. The first phase switch circuit includes a first switch and a second switch. The second phase switch circuit includes a third switch and a fourth switch. The first phase switch circuit and the second phase switch circuit are complementarily switched. The first switch and the second switch are synchronously turned on or off. The third switch and the fourth switch are synchronously turned on or off. A first terminal of the first switch and a first terminal of the third switch are connected to the first input terminal of the operational amplifier. A second terminal of the first switch is connected to a first terminal of the third capacitor and a first terminal of the fourth switch. A second terminal of the third switch is connected to a first terminal of the fourth capacitor and a first terminal of the second switch. A second terminal of the third capacitor and a second terminal of the fourth capacitor are grounded. A second terminal of the second switch and a second terminal of the fourth switch are coupled to a first reference voltage.

In certain embodiments, the current supplying component includes an optoelectronic component. The optoelectronic component is configured to convert light energy irradiated through the optoelectronic component into the current.

In certain embodiments, the counter further includes a comparator. A first input terminal of the comparator is connected to the output terminal of the operational amplifier. A second input terminal of the comparator is coupled to a second reference voltage. The comparator is configured to compare a voltage of the first input terminal of the comparator with a voltage of the second input terminal of the comparator to output a comparison signal.

In certain embodiments, the counter further includes a phase triggering circuit. The phase triggering circuit is connected to an output terminal of the comparator. The phase triggering circuit is configured to output a first phase signal and a second phase signal according to the comparison signal.

In certain embodiments, the phase triggering circuit is connected to a control terminal of the first phase switch circuit and a control terminal of the second phase switch circuit. The phase triggering circuit is configured to output the first phase signal to the first phase switch circuit and output the second phase signal to the second phase switch circuit. A level of the first phase signal is opposite to a level of the second phase signal.

In certain embodiments, when a voltage of the operation amplified signal increases to reach the second reference voltage, the comparator outputs the comparison signal at a high level. The phase triggering circuit switches the first phase switch circuit and the second phase switch circuit according to the comparison signal at the high level.

As described above, in the counter provided by the present disclosure, the first phase switch circuit and the second phase switch circuit are complementarily switched, such that the voltage of the operational amplifier is quickly reduced. Therefore, the counter of the present disclosure is capable of accurately counting pulse waves without using a high-speed operational amplifier that has a high frequency bandwidth and high conversion efficiency.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
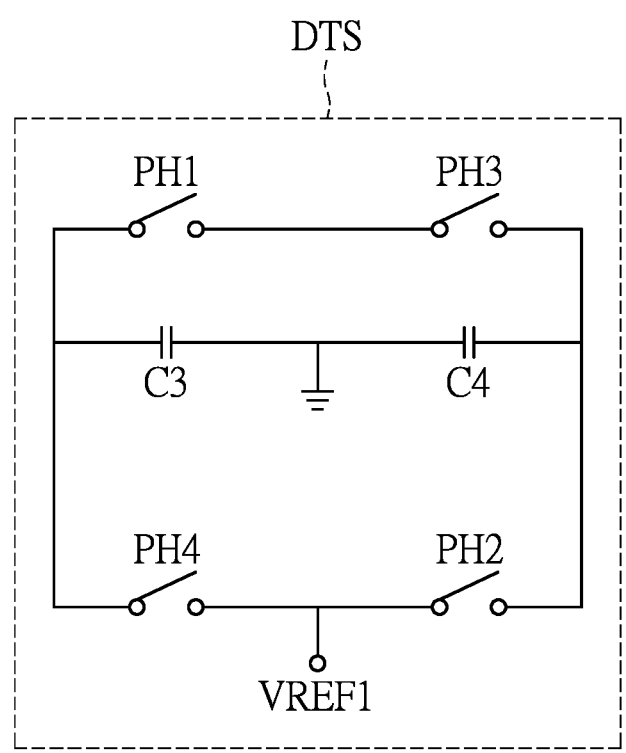
FIG. 1 is a circuit layout diagram of a charge distributing circuit of a counter according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
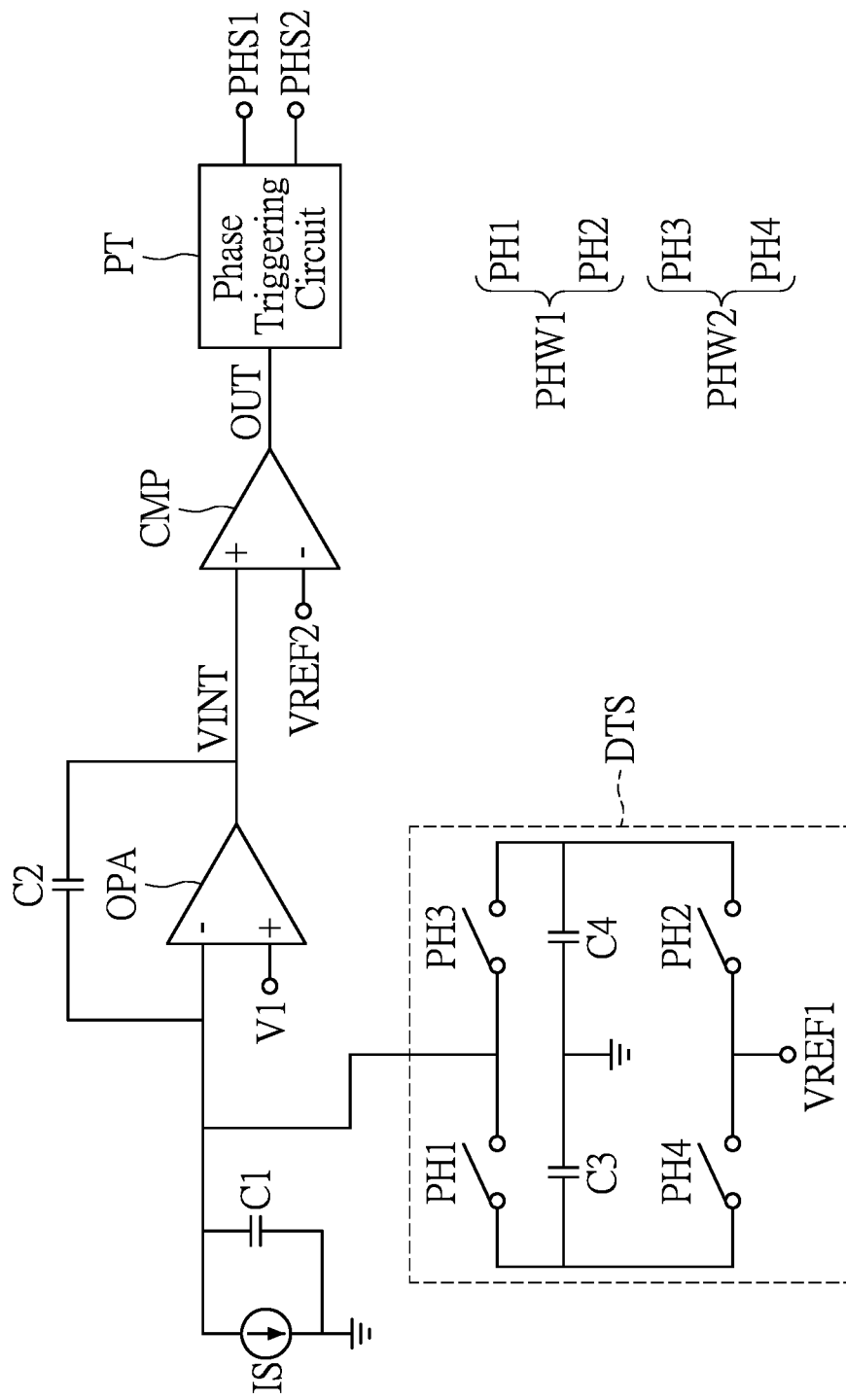
FIG. 2 is a circuit layout diagram of the counter according to the embodiment of the present disclosure.
Figure 3:
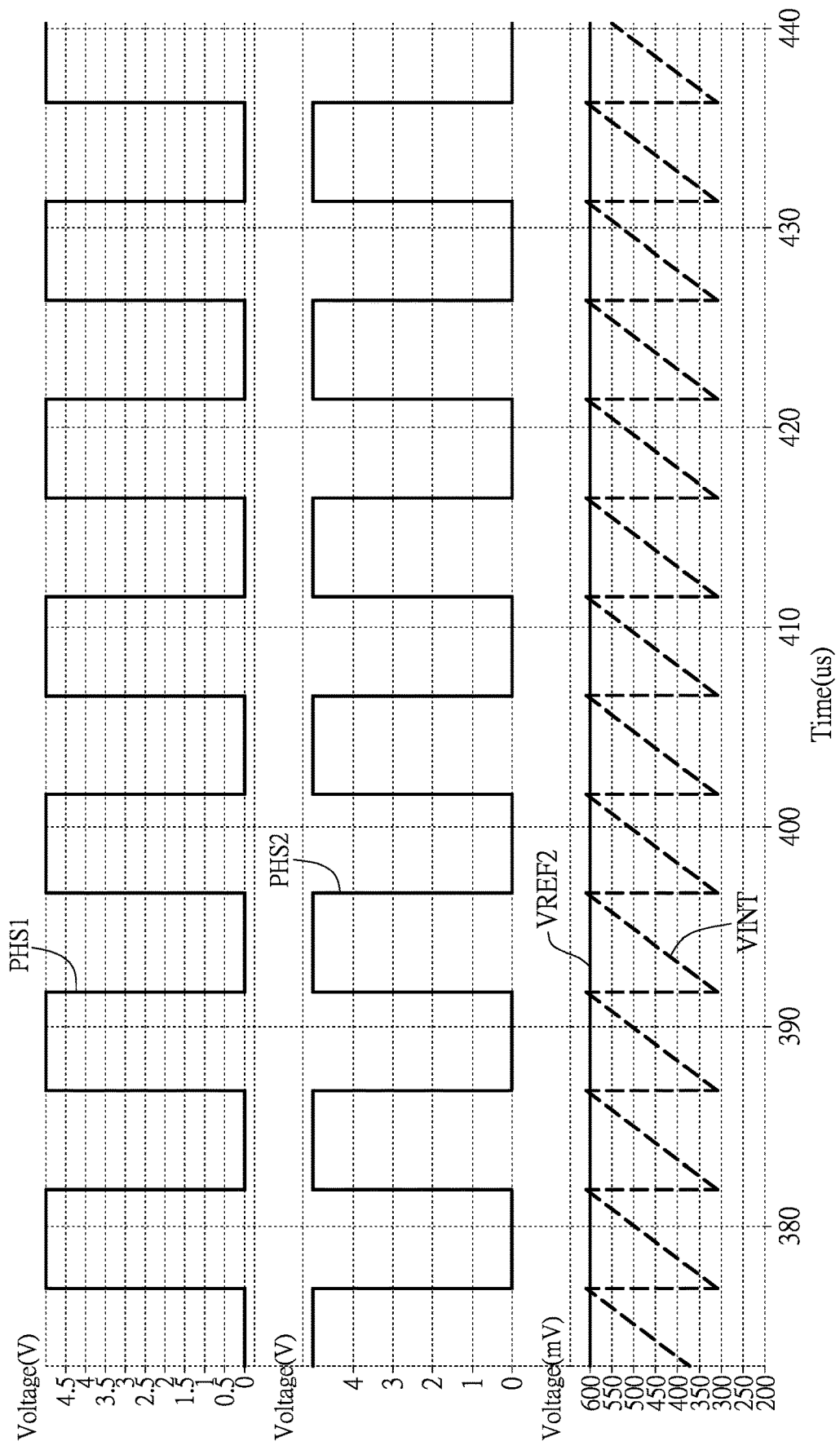
FIG. 3 is a waveform diagram of signals of the counter according to the embodiment of the present disclosure.

Reference is made to FIGS. 1 to 3, in which FIG. 1 is a circuit layout diagram of a charge distributing circuit of a counter according to an embodiment of the present disclosure, FIG. 2 is a circuit layout diagram of the counter according to the embodiment of the present disclosure, and FIG. 3 is a waveform diagram of signals of the counter according to the embodiment of the present disclosure.

As shown in FIG. 2, the counter may include a first capacitor C1, a current supplying component IS, an operational amplifier OPA, a second capacitor C2 and a comparator CMP.

The current supplying component IS is connected to the first capacitor C1 and configured to supply a current to the second capacitor C2 to charge the second capacitor C2. For example, the current supplying component IS includes an optoelectronic component. The optoelectronic component is used to convert light energy irradiated through the optoelectronic component into a current.

A first input terminal (such as a non-inverting input terminal) of the operational amplifier OPA is connected to a first terminal of the first capacitor C1. A second terminal of the first capacitor C1 is grounded. The first input terminal of the operational amplifier OPA is connected to an output terminal of the operational amplifier OPA through the second capacitor C2. A second input terminal (such as an inverting input terminal) of the operational amplifier OPA is coupled to an input voltage V1.

A first input terminal (such as an inverting input terminal) of the comparator CMP is connected to the output terminal of the operational amplifier OPA. A second input terminal (such as a non-inverting input terminal) of the comparator CMP is coupled to a second reference voltage VREF2. The comparator CMP is configured to compare a voltage of the first input terminal of the comparator CMP with the second reference voltage VREF2 to output a comparison signal OUT.

It is worth noting that, in the embodiment, the counter may further include a charge distributing circuit DTS shown in FIG. 1. The charge distributing circuit DTS may include a third capacitor C3, a fourth capacitor C4, a first phase switch circuit PHW1, and a second phase switch circuit PHW2. A capacitance of the third capacitor C3 may be equal to a capacitance of the fourth capacitor C4, but the present disclosure is not limited thereto.

The first phase switch circuit PHW1 may include a first switch PH1 and a second switch PH2. The second phase switch circuit PHW2 may include a third switch PH3 and a fourth switch PH4.

As shown in FIGS. 1 and 2, a first terminal of the first switch PH1 and a first terminal of the third switch PH3 are connected to the first input terminal of the operational amplifier OPA and the first terminal of the first capacitor C1. A second terminal of the first switch PH1 is connected to a first terminal of the third capacitor C3 and a first terminal of the fourth switch PH4. A second terminal of the third switch PH3 is connected to a first terminal of the fourth capacitor C4 and a first terminal of the second switch PH2. A second terminal of the third capacitor C3 and a second terminal of the fourth capacitor C4 are grounded. A second terminal of the second switch PH2 and a second terminal of the fourth switch PH4 are coupled to a first reference voltage VREF1. The first reference voltage VREF1 may be higher than the input voltage V1.

If necessary, the counter of the embodiment may further include a phase triggering circuit PT. The phase triggering circuit PT is connected to an output terminal of the comparator CMP. The phase triggering circuit PT may be configured to output a first phase signal PHS1 and a second phase signal PHS2 according to the comparison signal OUT. A working period of the first phase signal PHS1 may be the same as a working period of the second phase signal PHS2, but the present disclosure is not limited thereto.

The phase triggering circuit PT may be connected to a control terminal of the first phase switch circuit PHW1 and a control terminal of the second phase switch circuit PHW2. The phase triggering circuit PT may output the first phase signal PHS1 to the first phase switch circuit PHW1 and output the second phase signal PHS2 to the second phase switch circuit PHW2.

As shown in FIG. 3, a level of the first phase signal PHS1 is opposite to a level of the second phase signal PHS2. That is, when the first phase signal PHS1 is at a high level, the second phase signal PHS2 is at a low level. Conversely, when the first phase signal PHS1 is at a low level, the second phase signal PHS2 is at a high level. Therefore, waveforms of the first phase signal PHS1 are shifted from waveforms of the second phase signal PHS2. As a result, the first phase switch circuit PHW1 and the second phase switch circuit PHW2 are complementarily switched.

For example, when the first phase switch circuit PHW1 receives the first phase signal PHS1 at the high level, the second phase switch circuit PHW2 receives the second phase signal PHS2 at the low level. Under this condition, the first switch PH1 and the second switch PH2 of the first phase switch circuit PHW1 are turned on, and the third switch PH3 and the fourth switch PH4 of the second phase switch circuit PHW2 are turned off.

As a result, a charging current flows from the first reference voltage VREF1 to the fourth capacitor C4, such that a voltage of the fourth capacitor C4 is charged to be equal to the first reference voltage VREF1. Finally, the charging current may flow to the output terminal of the operational amplifier OPA through the second capacitor C2.

When the second capacitor C2 is charged by the current of the current supplying component IS such as the optoelectronic component (and the charging current), a voltage of the second capacitor C2 gradually increases, such that a rising waveform segment of an operation amplified signal VINT as shown in FIG. 3 is gradually generated.

The operational amplifier OPA multiplies a difference between a voltage of the first input terminal (such as the non-inverting input terminal) of the operational amplifier OPA and the input voltage V1 by a gain to output the operation amplified signal VINT. When a voltage of the operation amplified signal VINT increases to be higher than the second reference voltage VREF2, the operational amplifier OPA outputs the comparison signal OUT at a high level. That is, a pulse wave is generated in the comparison signal OUT.

The phase triggering circuit PT switches the first phase switch circuit PHW1 and the second phase switch circuit PHW2 according to the comparison signal OUT at the high level. For example, the phase triggering circuit PT switches the first switch PH1 and the second switch PH2 from an on state to an off state, and switches the third switch PH3 and the fourth switch PH4 from an off state to an on state. Alternatively, the phase triggering circuit PT switches the first switch PH1 and the second switch PH2 from the off state to the on state, and switches the third switch PH3 and the fourth switch PH4 from the on state to the off state.

After the first phase switch circuit PHW1 and the second phase switch circuit PHW2 are switched, the fourth capacitor C4 is discharged. When the voltage of the fourth capacitor C4 decreases, the voltage of the operation amplified signal VINT outputted by the operational amplifier OPA decreases from a peak value to a valley value such as 300 mV as shown in FIG. 3, but the present disclosure is not limited thereto.

After the above-mentioned charging and discharging operations are repeatedly performed, the comparison signal OUT generated by the comparator CMP has a plurality of pulse waves. The number of times that the charging and discharging operations are performed is equal to the number of the pulse waves counted by the counter. Therefore, when the counter is applied to an optical sensor, an ambient light intensity can be calculated according to the number of the pulse waves counted by the counter.

In summary, in the counter provided by the present disclosure, the first phase switch circuit and the second phase switch circuit are complementarily switched, such that the voltage of the operational amplifier is quickly reduced. Therefore, the counter of the present disclosure is capable of accurately counting the pulse waves without using a high-speed operational amplifier that has a high frequency bandwidth and high conversion efficiency.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A counter, comprising:
   a first capacitor;
   a current supplying component connected to the first capacitor and configured to supply a current to the first capacitor;
   an operational amplifier, wherein a first input terminal of the operational amplifier is connected to the first capacitor, the first input terminal of the operational amplifier is connected to an output terminal of the operational amplifier through a second capacitor, a second input terminal of the operational amplifier is coupled to an input voltage, and the operational amplifier is configured to multiply a difference between a voltage of the first input terminal of the operational amplifier and the input voltage by a gain to output an operation amplified signal; and
   a charge distributing circuit including a first phase switch circuit, a second phase switch circuit, a third capacitor and a fourth capacitor, wherein the first phase switch circuit includes a first switch and a second switch, the second phase switch circuit includes a third switch and a fourth switch, the first phase switch circuit and the second phase switch circuit are complementarily switched, the first switch and the second switch are synchronously turned on or off, and the third switch and the fourth switch are synchronously turned on or off;
   wherein a first terminal of the first switch and a first terminal of the third switch are connected to the first input terminal of the operational amplifier, a second terminal of the first switch is connected to a first terminal of the third capacitor and a first terminal of the fourth switch, a second terminal of the third switch is connected to a first terminal of the fourth capacitor and a first terminal of the second switch, a second terminal of the third capacitor and a second terminal of the fourth capacitor are grounded, and a second terminal of the second switch and a second terminal of the fourth switch are coupled to a first reference voltage.

2. The counter according to claim 1, wherein the current supplying component includes an optoelectronic component configured to convert light energy irradiated through the optoelectronic component into the current.

3. The counter according to claim 1, further comprising:
   a comparator, wherein a first input terminal of the comparator is connected to the output terminal of the operational amplifier, a second input terminal of the comparator is coupled to a second reference voltage, and the comparator is configured to compare a voltage of the first input terminal of the comparator with the second reference voltage to output a comparison signal.

4. The counter according to claim 3, further comprising:
   a phase triggering circuit connected to an output terminal of the comparator and configured to output a first phase signal and a second phase signal according to the comparison signal.

5. The counter according to claim 4, wherein the phase triggering circuit is connected to a control terminal of the first phase switch circuit and a control terminal of the second phase switch circuit, the phase triggering circuit is configured to output the first phase signal to the first phase switch circuit and output the second phase signal to the second phase switch circuit, and a level of the first phase signal is opposite to a level of the second phase signal.

6. The counter according to claim 5, wherein, when a voltage of the operation amplified signal increases to reach the second reference voltage, the comparator outputs the comparison signal at a high level, and the phase triggering circuit switches the first phase switch circuit and the second phase switch circuit according to the comparison signal at the high level.

* * * * *